(12) United States Patent
Makela et al.

(10) Patent No.: US 8,883,258 B2
(45) Date of Patent: Nov. 11, 2014

(54) PROTECTIVE COATING OF SILVER

(75) Inventors: Milja Makela, Lahti (FI); Pekka Soininen, Helsinki (FI); Sami Sneck, Vantaa (FI)

(73) Assignee: Beneq Oy, Vantaa (FI)

( * ) Notice: Subject to any disclaimer, the term of this patent is extended or adjusted under 35 U.S.C. 154(b) by 606 days.

(21) Appl. No.: 12/162,051

(22) PCT Filed: Jan. 31, 2007

(86) PCT No.: PCT/FI2007/050056
§ 371 (c)(1),
(2), (4) Date: Jul. 24, 2008

(87) PCT Pub. No.: WO2007/088249
PCT Pub. Date: Aug. 9, 2007

(65) Prior Publication Data
US 2009/0004386 A1    Jan. 1, 2009

(30) Foreign Application Priority Data

Feb. 2, 2006   (FI) ........................................ 20065082

(51) Int. Cl.
C23C 16/455 (2006.01)
A44C 27/00 (2006.01)
C23C 16/40 (2006.01)

(52) U.S. Cl.
CPC ......... *C23C 16/403* (2013.01); *C23C 16/45525* (2013.01); *A44C 27/005* (2013.01); *C23C 16/45555* (2013.01); *C23C 16/405* (2013.01)
USPC ....................................................... 427/248.1

(58) Field of Classification Search
CPC .................................................. C23C 16/45525
See application file for complete search history.

(56) References Cited

U.S. PATENT DOCUMENTS

| | | | |
|---|---|---|---|
| 4,058,430 A | 11/1977 | Suntola et al. | |
| 4,413,022 A | 11/1983 | Suntola et al. | |
| 4,495,254 A * | 1/1985 | Hoffman | ........................ 428/632 |
| 6,773,757 B1 * | 8/2004 | Redline et al. | ................. 427/404 |
| 6,897,119 B1 | 5/2005 | Sneh et al. | |
| 2004/0159830 A1 | 8/2004 | Weimer et al. | |
| 2006/0007677 A1 | 1/2006 | Israel et al. | |

FOREIGN PATENT DOCUMENTS

| | | |
|---|---|---|
| CH | 591 566 A5 | 9/1977 |
| DE | 44 15 122 A1 | 11/1995 |
| EP | 0 679 729 A1 | 11/1995 |
| JP | A-62-180071 | 8/1987 |
| JP | A-63-213655 | 9/1988 |

OTHER PUBLICATIONS

Suntola (Handbook of Crystal Growth, vol. 3, edited by D.T.J. Hurle (1994), pp. 601-608).*

(Continued)

*Primary Examiner* — Michael Cleveland
*Assistant Examiner* — Joel Horning
(74) *Attorney, Agent, or Firm* — Oliff PLC

(57) ABSTRACT

In the method, silver is protected against tarnishing using an Atomic Layer Deposition method. In the Atomic Layer Deposition method, a thin film coating is formed 5 on the surface of silver by depositing successive molecule layers of the coating material. For example aluminum oxide (Al 2O3) or zirconium oxide may be used as the coating material.

14 Claims, 2 Drawing Sheets

(56) References Cited

OTHER PUBLICATIONS

Mar. 16, 2010 Search Report issued in European Application No. 07704826.2.

Matero et al., "Atomic layer deposited thin films for corrosion protection," *Journal of Physics IV*, vol. 9, No. 8, Pt. 1, pp. 493-499, Sep. 1999.

Groner et al., "Electrical characterization of thin $Al_2O_3$ films grown by atomic layer deposition on silicon and various metal Substrates," *Thin Solid Films*, vol. 413, pp. 186-197, 2002.

Translation of Mar. 11, 2010 Office Action issued in Chinese Patent Application No. 200780004086.3.

Nov. 12, 2012 Notice of Opposition (with Annex) issued in European Application No. 07704826.2.

Groner, M.D. et al., "Electrical characterization of thin $Al_2O_3$ films grown by atomic layer deposition on silicon and various metal substrates," Thin Solid Films, 413 (2002) pp. 186-197.

Spectra Technology Inc., "Grazing Incidence Absorption Measurements," Final Report 9-X18-8599Q-1 (1989).

Pilvi, T., "Atomic Layer Deposition for optical applications: metal fluoride thin films and novel devices," Academic Dissertation, Helsinki (2008).

Matero, R., "Atomic Layer Deposition of Oxide Films-Growth, Characterisation and Reaction Mechanism Studies," Academic Dissertation, Helsinki (2004).

Ritala et al., "Atomic Layer Deposition," Chapter 2, ISBN 0-12-512909-2, Helsinki (2002), pp. 103-159.

Aug. 23, 2012, Office Action cited in JP 2008-552836 (with English translation).

Dicing Tape 1008 R: Silikonfrei, Laborprotokoll Reinigung and Beschichtung, Oct. 21, 2009, Selte 10 von 12.

\* cited by examiner

PROTECTIVE COATING OF SILVER

FIELD OF THE INVENTION

The present invention relates to a method for coating silver products, and more particularly to a method according to the preamble of claim 1 coating silver.

BACKGROUND OF THE INVENTION

Silver naturally tarnishes in the atmosphere, especially in the presence of sulphur. Industrial atmospheres and natural digestive processes are important sources for the tarnishing of silver. When silver is tarnished, sulphides, oxides or carbonates are formed on the surface of silver. The tarnishing of silver and silverware is a problem for example for the utility article, jewelry and giftware industries as well as to the end users of the silver products. Tarnishing degrades the appearance of the product as a layer or spots of black or dark grey colour are formed. It can be removed but this is usually a laborious process, and the process may affect the appearance of the product negatively. Also in technical applications the tarnishing of the silver reduces the optical properties, such as reflectivity, of silver and silver products and parts.

Methods for preventing tarnishing in advance are known in the prior art. One existing method for preventing tarnishing comprises using silver alloys that are designed with resistance to oxidation and involve the mixing of special additives, such as silicon or germanium, with silver. Another existing method for preventing tarnishing comprises coating pure silver using rhodium. One of the problems associated with the above arrangement using silver alloys is that the method requires all factors to be carefully controlled during manufacture, like using extremely pure new metal and accurate temperature control in melting and annealing. As a result, the manufacturing process and the equipment to carry out the process are very expensive to set up. The cost is also prohibitive in the method for coating silver with rhodium. Further, the rhodium coating has a blue-white shade, and thus a silver product coated with rhodium may become visually different from pure silver.

Other existing methods for preventing tarnishing of silver comprise coating the finished silver product, article or part with a method that provides a layer of material on the silver product, article or part which prevents or restrains tarnishing on the finished silver product, article or part. These kind of prior art methods comprise varnishing the silver products. The problem with these known coating methods is that the coating layer is not uniform over the whole product or part of the product that has been coated. The thickness variations in the coating layers over the silver product cause colour variations, for example due to interference, or other optical alterations, which are not preferable. These known methods also produce relatively thick layers of coating materials on the silver products. This further has a negative influence on the appearance of a silver product. Varnish may also yellow and peel off. Thus, the known methods for preventing tarnishing of a silver product do not provide a uniform and substantially to human eye invisible coating, but a non-uniform coating and/or a coating producing discoloration of a silver product.

BRIEF DESCRIPTION OF THE INVENTION

An object of the present application is to provide a method so as to alleviate the above disadvantages. The objects of the application are achieved by a method according to the characterizing portion of claim 1. Therefore the present invention is characterized by applying a thin coating of protective material on at least a part of the surface of a silver product, article or part using an ALD (Atomic Layer Deposition) method.

Preferred embodiments are disclosed in the dependent claims.

The term thin layer means in this context a layer having thickness between 1 nm and 1 µm, preferably between 1 and 100 nm, and most preferably approximately 2-20 nm.

In the method a thin film coating is deposited on the surface of a silver object. In the present solution, silver is coated with one or more molecule layers of aluminium oxide $Al_2O_3$. Trimethyl aluminium $(CH_3)_3Al$ may be used as a precursor and water $H_2O$ as an oxygen source. The thickness of the generated thin film per one ALD cycle is about 0.1 nm and the coating is carried out in a temperature of about 200° C.

In experiments desired results have been achieved by depositing about 3 nm coating of $Al_2O_3$ on a silver product by using 30 ALD cycles with successive pulses of trimethyl aluminium (TMA) and water. Thicker coatings have also been tested to determine the relation between the color of the coating and the thickness of the coating. Another good thickness range is found be about 70 nm range. This thickness may be achieved by depositing about 70 nm coating of $Al_2O_3$ on a silver product by using 700 ALD cycles with successive pulses of TMA and water. An advantage of the present solution is that it is possible to produce a thin coating, which effectively prevents silver from tarnishing without altering the appearance of the silver product. Also the optical properties of the silver will remain substantially unaltered. Thus the coating passivates the silver surface. The coating generated by the method is thin, dense, smooth and substantially colourless, and it precisely follows conformally the shapes, also three dimensional shapes, of the silver object without thickness variations in the coating. By means of the present solution, a stable, uniform and attractive coating may be achieved. The generated coating is compatible with foodstuffs. The consumption of the coating material is low, and thus coating costs may be reduced. The thickness of the coating layer may be controlled by varying the number of molecule layers in the coating. The coating process is not sensitive to minor changes in the process parameters, and thus the repeatability of the method is good. This thin layer is sufficient for preventing the tarnishing of the silver, but does not affect the appearance of the silver product, as the conventional coating methods. The coating may be so thin that human eye cannot see it. Such a uniform layer is not possible to be provided on a three dimensional object for example with CVD method (Chemical Vapour Deposition) or PVD (Physical Vapour Deposition) method, since the coating process may not be controlled in such a detail as with ALD method. CVD and other similar methods also require that the coated object have to be rotated for providing coating material over the whole surface of the three dimensional object.

BRIEF DESCRIPTION OF THE DRAWINGS

In the following, the invention will be described in greater detail by means of preferred embodiments with reference to the accompanying drawings, in which.

DETAILED DESCRIPTION OF THE INVENTION

Silver naturally tarnishes in the atmosphere, especially in the presence of sulphur. Industrial atmospheres and natural digestive processes are important sources for the tarnishing of silver. When silver is tarnished, sulphides, oxides or carbonates are formed on the surface of silver. Tarnishing degrades the appearance of the product as a layer or spots of black or dark grey colour are formed. Also in technical applications the tarnishing of the silver reduces the optical properties, such as reflectivity, of silver and silver products and parts. For preventing the tarnishing of surfaces of a silver product a thin coating may be provided on the surfaces of the silver product. The coating should be sufficiently thin for preventing the change of the appearance of the silver product, but sufficiently thick to provide good passivation and/or protection against tarnishing. This kind of thin coating may be applied on the surfaces of a silver product preferably by using Atomic Layer Deposition (ALD).

Atomic Layer Deposition is a thin film technique that allows thin film coatings that have a nanoscale thickness to be manufactured. ALD technique may also be called ALC (Atomic Layer Coating) technique or ALE (Atomic Layer Epitaxy) technique. The ALD is based on a gas phase process where primary compounds are typically evaporated and pulsed into a reaction chamber separately. A thin film is generated when the material obtained from the reaction between the primary compounds is deposited on the surface to be coated. The material is deposited on the surface such that successive layers of molecule level are deposited one by one. This may be called "growing" of the material. Thin film materials obtained by means of the ALD technique include, for example, metal oxides and metal nitrides.

In the Atomic Layer Deposition method, a thin film coating is formed on the surface of silver by depositing successive molecule layers of one or more coating materials.

According to the solution of the present application, the ALD technique is adapted to coating an object comprising silver. In the present solution, the object comprising silver is coated with a coating comprising aluminium oxide $Al_2O_3$. However, any colourless metal oxide, such as zirconium oxide $ZrO_2$, titanium oxide $TiO_2$, chromium oxide $Cr_2O_3$, indium oxide $In_2O_3$, niobium oxide $Nb_2O_5$, or any other material obtainable by the ALD technique may also be used.

Figure 1:
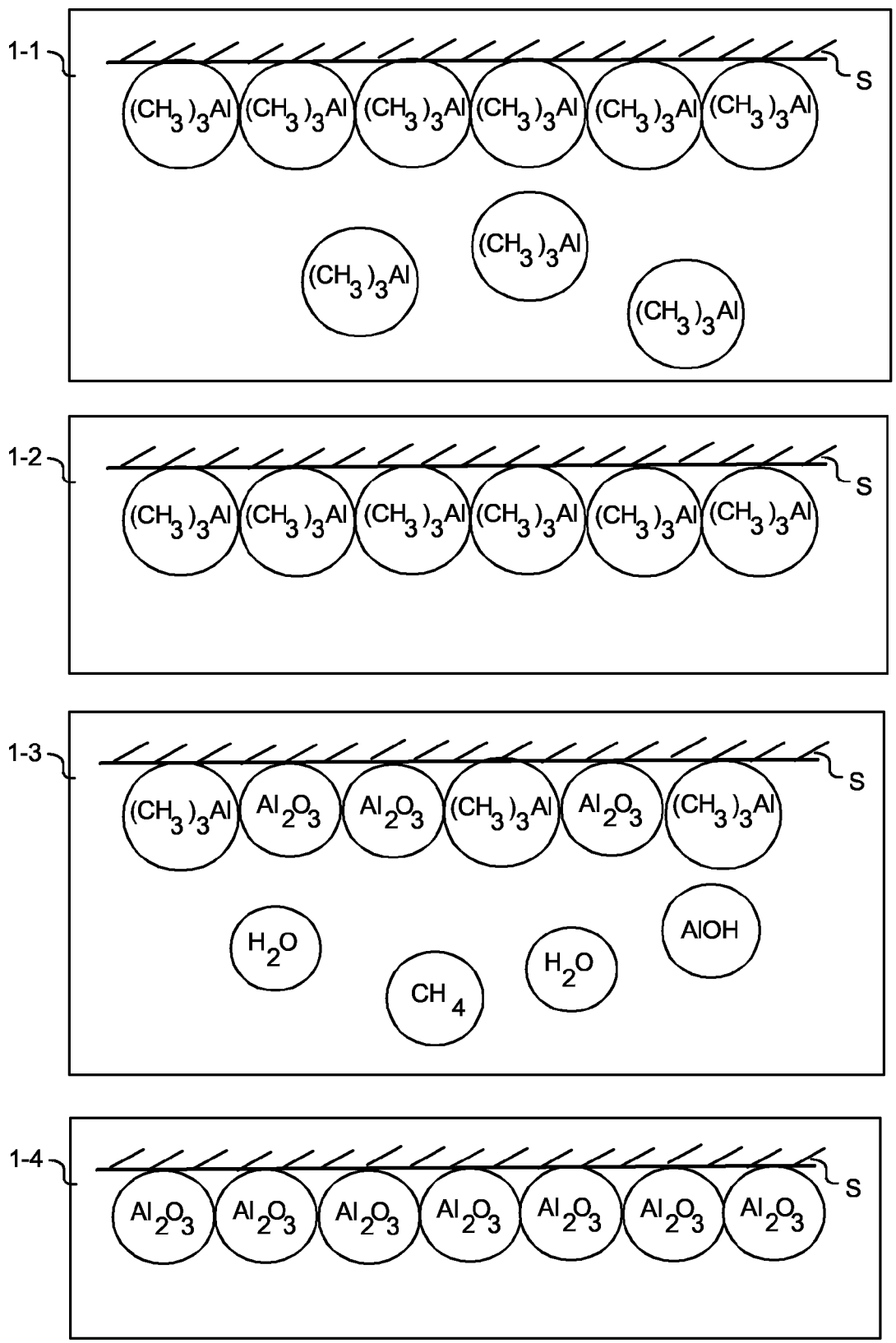
FIG. 1 is a schematic representation of the coating process of silver with aluminium oxide according to the solution of the present application.

FIG. 1 illustrates an embodiment of the present solution showing the coating of a silver surface S with aluminium oxide $Al_2O_3$. The coating is built up of molecule layers of aluminium oxide. FIG. 1 shows a situation where trimethyl aluminium $(CH_3)_3Al$ and water $H_2O$ are used as primary materials. If silver were coated with $ZrO_2$, for example, $ZrCl_4$ and $H_2O$ might be used as primary materials.

In step 1-1, the surface S is exposed to gas comprising trimethyl aluminium, in which case a layer of trimethyl aluminium molecules $(CH_3)_3Al$ is formed on the surface S. In step 1-2, the residual gas has been removed, and the layer comprising trimethyl aluminium molecules $(CH_3)_3Al$ remains on the surface S. In step 1-3, the surface S has further been exposed to water $H_2O$. In the reaction between trimethyl aluminium $(CH_3)_3Al$ and water, aluminium oxide $Al_2O_3$ is formed. The reaction proceeds stepwise, and also other compounds may be formed, such as aluminium hydroxide AlOH and methane $CH_4$. During the reaction, aluminium oxide $Al_2O_3$ is deposited on the surface S. Step 1-4 shows a situation where unreacted trimethyl aluminium $(CH_3)_3Al$ and eventual other compounds have been removed, and there is a layer of aluminium oxide $Al_2O_3$ deposited on the surface S.

The thin film coating of the present solution is obtained by growing of the material. This is carried out by repeating the steps 1-1 to 1-4 of FIG. 1 several times such that successive layers of aluminium oxide molecules are deposited on the surface S. The thickness of the coating may be controlled by varying the number of molecule layers.

Figure 2:
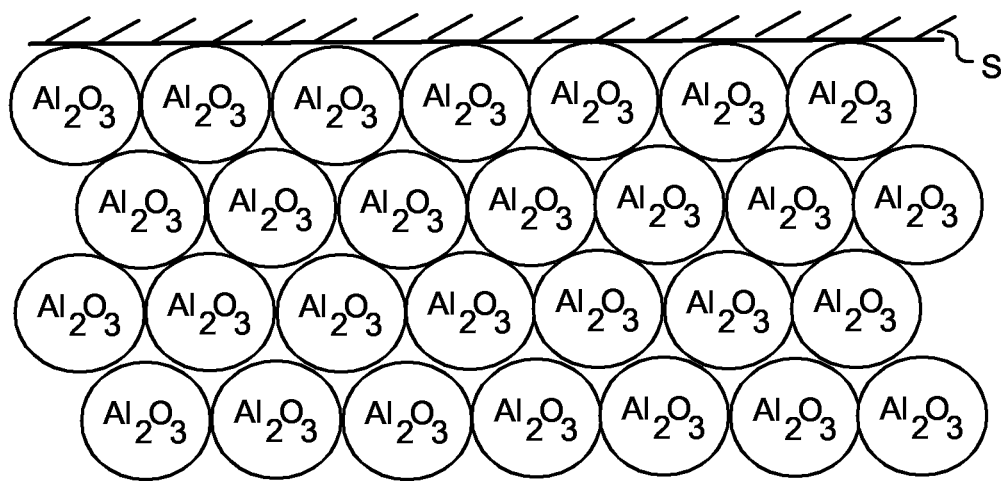
FIG. 2 is a schematic representation of the structure of the coating according to the solution of the present application.

FIG. 2 illustrates a situation where the coating on the surface S of silver comprises four molecule layers of aluminium oxide $Al_2O_3$. In reality, the number of successive layers of aluminium oxide $Al_2O_3$ may be other than four.

In the coating process, usually a coating that is as thin as possible is desirable such that it will still be sufficiently thick in order to have the desired properties. According to the present solution, the thickness of the coating is preferably within the range of 1 nanometer to 1 micrometer, more preferably within the range of 5 to 200 nanometers, most preferably about 10 nanometers. The thickness of the coating may be adjusted by varying the number of the molecule layers of the coating material.

Experiments have shown, that the one preferable thickness range is between 1 and 15 nm. The yellowish appearance increases as the thickness of the coating increases (in range 0 to 50 nm) being very disturbing as the thickness of the coating is 20 nm or more. On the other hand the protective and/or passivating effect of the coating gets better as the thickness of the coating increases. Therefore, the thickness of the coating should be a compromise between the protection against tarnishing and the appearance of the silver product.

Another good thickness range is reached when the interference of the thin coating starts to intensify the blue color. Thus the blue color effect produced by the coating makes it brighter to the human eye. This kind of effect may be produced with aluminum oxide deposited with ALD on a silver product when the thickness of the coating is in range about 60 to 90 nm. In this case also the passivation and/or protective effect of the coating is good. The blue interference appears as a series also when the thickness of the coating is increased, but then also other colors may appear depending on the angle of view of the product and furthermore the processing of the silver product becomes slower and more expensive.

The above mentioned effect may also be achieved with other colourless or substantially colourless materials or coatings in addition to aluminium oxide. The preferable thickness ranges vary according to material, because of the differences in the refractive index of the materials.

The lower of the mentioned thickness ranges (1-15 nm) requires ability to make very uniform and thin coatings as well as a low refractive index for the coating material. This is because of the fact that the yellowish appearance becomes a dominant feature before a sufficient thickness for the passivation and protection is achieved when materials having high refractive index are used. Aluminium oxide has proved to be one suitable material for providing thin uniform coatings to prevent tarnishing of a silver product when ALD is used. For example, when zirconium oxide is used, the appearance of a silver product becomes too yellowish before the sufficient passivation level is reached. A thin coating is preferable for the silver product. Then a material having low refractive index may be used. On the other hand, if excellent passivation is required and thus the thickness of the coating must be increased. In this case a material having higher refractive index may be used for achieving desired result, since the desired result may be achieved with thinner coating compared to material having lower refractive index.

The solution of the present application is based on the idea of protecting silver against tarnish by coating it using ALD (Atomic Layer Deposition) method. ALD is suitable for a precise production of very thin coatings. As a method ALD is also very suitable for commercial production requirements. The scalability and versatility of ALD makes an attractive method for producing coatings in industrial production.

Experiments have shown that the growth produced by ALD starts as columns and not until the coating is approximately 3 nm in thickness it is sufficiently uniform and unbroken for preventing the surface of a silver product from tarnishing. On the other hand, when aluminium oxides are used as coatings, the surface of a silver product starts to look yellowish already when the thickness of the coating is 10 nm. Therefore, as optically more coarse material is chosen the thickness of the coating may be larger, but when optically more dense material is chosen the thickness of the coating should be decreased for preventing the yellowish appearance of the product. Some of the materials may even produce a yellowish appearance for the product when the thickness of the coating is not even sufficient for producing a uniform and unbroken coating. Accordingly, the thickness of the substantially invisible coating produced by ALD may differ depending on the materials used such that the coating on a silver product is sufficient for producing a uniform and unbroken coating, but sufficiently thin for preventing discoloration of a silver product. Here, the optical dense is influenced, in addition to the refraction index, by reflectance factors, boundaries, imaginary components etc.

The temperature used in the coating process depends on the material properties. In many cases, it is advantageous to use a relatively high temperature. A high temperature allows molecules to evaporate readily, and a coating having a sufficiently good quality is obtained. According to the present solution, the coating temperature is preferably within the range of 80 to 400° C., more preferably within the range of 120 to 300° C., most preferably about 200° C.

Aluminum oxide process functions at least in a temperature range 100 to 250° C., and part even in a temperature range 20 to 300° C. These relatively low temperature ranges enable the coating for preventing tarnishing to be deposited after possible gemstones are planted and/or assembly solder joints or other assembly steps are conducted. Thus, all surfaces may be protected and there is no need to touch the surfaces with tools. The low temperature also enables rapid processing of the silver products using these low temperatures, which also makes treatment more simple and advantageous.

According to another embodiment of the present solution only a part of an object or a surface is coated.

According to yet another embodiment of the present solution, the method is applied together with one or more protecting methods other than the method described herein. In that case, the use of silver alloys that are resistant to oxidation, for example, may be applied.

According to yet another embodiment of the present solution, the method is applied to coating silver-plated objects.

According to yet another embodiment of the present solution, the method is applied to coating silver alloys.

According to yet another embodiment of the present solution, the method is applied to coating objects or surfaces comprising bronze, copper and/or brass. In other words this same method may be used to coat also other metals so that the appearance of the metal is not influenced.

The method enables objects of various shapes to be coated. Thus it may be applied to coating jewels, ornaments, tableware, etc., as well as various industrial components.

It should be noted that the use of aluminium oxide is not necessarily required by the present solution; any other coating material obtainable by the ALD technique, such as titanium oxide ($TiO_2$), tantalum oxide ($Ta_2O_5$) and/or zirconium oxide ($ZrO_2$), may also be used. Different coating materials may be used simultaneously. The obtained coating should have the desired properties and it should be compatible with the metal to be coated such as silver. Instead of $(CH_3)Al$, also other compounds may be used as precursors, such as aluminium chloride $AlCl_3$ and/or triethyl aluminium ($CH_3CH_2)_3Al$. Instead of water, also other compounds, such as hydrogen peroxide $H_2O_2$, ozone $O_3$, etc may be used as the oxygen source. The choice of the coating material may depend on the application. For example, tableware or jewelry may require a biocompatible coating layer. An example of a biocompatible coating material is aluminium oxide $Al_2O_3$. Reactions illustrated in FIG. 1 may occur in different order and also other reactions and/or steps may be carried out.

It is also possible to provide a coating having nanolaminate structure using ALD with two or more different coating materials. Then protective material is applied on the surface of a silver product such that one or more successive molecule layers are deposited and then another protective material is applied on the surface of a silver product such that one or more successive molecule layers are deposited. This may be continued until a predetermined coating thickness is achieved. It is also possible use three or more different materials in the mentioned successive manner. This provides a coating comprising two or more layers of two or more protective materials.

The applied coating is generally so thin that it is invisible to human eye. The method may therefore be applied to silver jewelry, coins, medals, tableware, ornaments or the like silver products. The method may also be applied to products comprising several different materials in addition to silver. Furthermore, the method according to the present invention may be applied to at least part of an electronic or electrical component or other industrial component made of silver or silver alloys.

It will be obvious to a person skilled in the art that as technology advances, the inventive concept can be implemented in various ways. The invention and its embodiments are not limited to the examples described above but may vary within the scope of the claims.

The invention claimed is:

1. A method for protecting silver products, articles or parts against tarnish in an atmosphere, the method consisting of applying a thin coating layer of protective material having a thickness between 60 nm to 90 nm on at least a part of an outer surface of a silver product, article or part using an ALD (Atomic Layer Deposition) method to prevent tarnishing of the outer surface of the silver product, article or part in the atmosphere.

2. The method according to claim 1, wherein applying the thin coating layer comprises providing at least one layer of metal oxide using the ALD (Atomic Layer Deposition) method.

3. The method according to claim 2, wherein the metal oxides comprise aluminum oxide $Al_2O_3$, titanium oxide $TiO_2$, chromium oxide $Cr_2O_3$, zirconium oxide $ZrO_2$, indium oxide $In_2O_3$, and niobium oxide $Nb_2O_5$.

4. The method according to claim 1, wherein the thin coating layer is substantially transparent non-oxide material.

5. The method according to claim 1, comprising applying a substantially colorless coating layer on at least a part of the outer surface of the silver product, article or part.

6. The method according to claim 1, comprising applying said thin coating layer at a temperature, which is in a range of 80 to 400° C.

7. The method according to claim 6, comprising applying said thin coating layer at a temperature, which is in a range of 120 to 300° C.

8. The method according to claim 6, comprising applying said thin coating layer at a temperature, which is 200° C.

9. The method according to claim 1, wherein the thin coating layer is produced on a multiple-part silver product after the product is assembled.

10. The method according to claim 1, wherein the method is applied to silver jewelry, coins, medals, tableware, ornaments, or at least a part of an electronic or electrical component or other industrial component made of silver or silver alloys.

11. The method according to claim 1, wherein the method is applied to products comprising several different materials in addition to silver.

12. A method for protecting silver products, articles or parts against tarnish in an atmosphere, the method comprising applying a thin coating of protective material having a thickness between 60 nm to 90 nm on at least a part of an outer surface of a silver product, article or part using an ALD (Atomic Layer Deposition) method to prevent tarnishing of the outer surface of the silver product, article or part in the atmosphere.

13. The method according to claim 12, wherein interference produced as a result of the thin coating of protective material intensifies a blue color of the thin coating of the silver product, article or part.

14. A method for protecting silver products, articles or parts against tarnish in an atmosphere, the method comprising applying a thin coating of protective material having a thickness between 60 nm to 90 nm on at least a part of a silver surface of the silver product, article or part using an ALD (Atomic Layer Deposition) method to prevent tarnishing of the outer surface of the silver product, article or part in the atmosphere, wherein interference produced as a result of the thin coating of protective material intensifies a blue color of the thin coating of the silver product, article or part.

* * * * *